United States Patent
Kubota et al.

[11] Patent Number: 5,824,152
[45] Date of Patent: Oct. 20, 1998

[54] SEMICONDUCTOR SINGLE-CRYSTAL PULLING APPARATUS

[75] Inventors: Toshimichi Kubota; Toshiro Kotooka; Toshiaki Saishoji; Tetsuhiro Iida, all of Hiratsuka, Japan

[73] Assignee: Komatsu Electronic Metals Co., Ltd., Hiratsuka, Japan

[21] Appl. No.: 680,522

[22] Filed: Jul. 9, 1996

[51] Int. Cl.[6] .................................................. C30B 15/14
[52] U.S. Cl. ............................ 117/217; 117/208; 117/31; 117/34
[58] Field of Search ................. 117/34, 31, 217, 117/208

[56] References Cited

U.S. PATENT DOCUMENTS

| | | | |
|---|---|---|---|
| 4,330,361 | 5/1982 | Kuhn-Kuhnenfeld | 117/217 |
| 4,956,153 | 9/1990 | Yamagishi et al. | 117/217 |
| 5,476,065 | 12/1995 | Ikezawa et al. | 117/217 |
| 5,575,847 | 11/1996 | Kuramochi et al. | 117/217 |

FOREIGN PATENT DOCUMENTS

| | | | |
|---|---|---|---|
| 390503 | 3/1990 | European Pat. Off. | 117/217 |
| 5-279172 | 10/1993 | Japan | 117/217 |

*Primary Examiner*—Robert Kunemund
*Attorney, Agent, or Firm*—Varndell Legal Group

[57] ABSTRACT

In the manufacture of a single crystal using a semiconductor single-crystal pulling apparatus equipped with a radiation screen, the time of passage of the single crystal through the high-temperature region of 1050° C. and above is made to be long and the time of passage of the single crystal through the temperature region of about 900° C.–500° C. is made to be short. The semiconductor single-crystal pulling apparatus is so constructed that a radiation screen comprises an upper screen of 3-layer construction consisting of a heat-insulating member made of graphite or ceramics fiber clad with outer members made of graphite and a lower screen 3 of single-layer construction made of graphite, quartz or fine ceramics. Radiant heat from the molten liquid heats the lower part of single crystal as it passes through lower screen, thereby prolonging its period of passage through the high-temperature region. The radiant heat cannot reach single crystal when it is surrounded by upper screen, so it is cooled comparatively abruptly and can pass through the temperature region of about 900–500° C. in a short time.

13 Claims, 6 Drawing Sheets

SEMICONDUCTOR SINGLE-CRYSTAL PULLING APPARATUS

BACKGROUND OF THE INVENTION

1. Field of the Invention

The present invention relates to a semiconductor single-crystal pulling apparatus provided with a radiation screen whose lower end is arranged adjacent to the surface of the molten liquid and surrounding the periphery of the pulled single crystal.

2. Description of the Related Art

As the substrate of semiconductor elements, high-purity single-crystals of silicon are chiefly employed. One method of manufacturing such single crystals is the Czochralski method (hereinbelow called the CZ method), in which a single crystal of cylindrical shape is pulled from molten raw material liquid in a crucible. In the CZ method, polycrystalline raw material is used to fill a crucible arranged in a chamber of a semiconductor single-crystal pulling apparatus, the raw material being melted by means of a heater arranged at the periphery of the crucible. A seed crystal mounted on a seed chuck is then dipped into the molten liquid and the single crystal is grown by raising the seed chuck whilst rotating the seed chuck and crucible in the same or opposite directions.

In such a single-crystal pulling apparatus, as a means for increasing the speed of pulling the single crystal and increasing the degree to which it is dislocation-free whilst preventing contamination by impurities, it is known to arrange a radiation screen at the periphery of the single-crystal pulling region. FIG. 6 is a cross-sectional view showing diagrammatically part of a semiconductor single-crystal pulling apparatus provided with such a radiation screen. The radiation screen 1 is a heat screen that envelopes the single-crystal pulling region. Typically, it is shaped as a conical sleeve wherein the diameter of the lower aperture is smaller than the diameter of the upper aperture. Radiation screen 1 promotes cooling of the single-crystal 6 by screening the single-crystal 6 from radiant heat applied to the single-crystal 6 radiated from molten liquid 4, quartz crucible 5 etc and so enables the single-crystal pulling speed to be raised and the occurrence of crystal defects to be prevented. Also, inert gas introduced from the top of chamber 7 is conducted to the periphery of single crystal 6 so as to form a gas flow from the middle of quartz crucible 5 through the peripheral region to the exhaust aperture provided at the bottom of chamber 7, thereby providing the function of eliminating gas that interferes with single-crystal formation such as silicon oxide produced from molten liquid 4 and metallic vapor etc produced from graphite crucible 8 etc. In FIG. 6, reference numeral 9 is a heater and 10 is a temperature-maintaining jacket.

Thanks to the promotion of cooling of the single crystal by the provision of a radiation screen, the rate of single crystal formation can be improved by enabling the time taken for the single crystal to pass through the temperature region of about 900° C. to 500° C., in which the frequency of formation of crystal defects is believed to be high, to be reduced, and by enabling silicon oxide etc to be efficiently discharged. However, making the single crystal pass through the temperature region of about 900° C. to 500° C. in a short time does not necessarily result in a high-quality wafer being obtained that is stable after device processing. In more detail, in the conventional single-crystal pulling apparatus provided with a radiation screen the single crystal is made to pass through all temperature regions in a short time, so it is difficult to make the pulled single crystal dwell for a long time in the high temperature region of 1050° C. or more that is needed to obtain a wafer of good oxide-film voltage-withstanding ability. If no radiation screen is provided and the single-crystal pulling speed is lowered, although the oxide-film voltage-withstanding ability is raised, the device reject rate tends to be increased due to lowering of the rate of single-crystal formation and occurrence of OSF (oxidation-induced stacking faults) or dislocation loops. Therefore, the single-crystal production rate is lowered.

If, in single-crystal pulling, the separation between the lower end of the radiation screen and the molten liquid surface is made wider than conventionally, the bottom-end portion of the single-crystal is not effectively screened by the radiation screen during pulling and so is difficult to cool. Consequently, the time taken for the single crystal to pass through the high temperature region of 1050° C. or more may become long, while the temperature region of about 900° C. to 500° C., in which the single crystal is subject to the screening effect of the radiation screen may be passed through in a short time. However, the separation between the bottom end of the radiation screen and the molten liquid surface had to be maintained as conventionally in order to achieve efficient discharge of silicon oxides etc and control the oxygen concentration in the single-crystal precisely while maintaining single-crystal productivity.

SUMMARY OF THE INVENTION

With the foregoing in view, it is an object of the present invention to provide a semiconductor single-crystal pulling apparatus equipped with a radiation screen, wherein the amount of time taken by the single crystal to pass through the high temperature region of 1050° C. or more is as long as possible, yet the temperature region of about 900° C. to 500° C. is passed through rapidly, and wherein discharge of silicon oxide etc can be performed efficiently by an inert gas current.

In order to achieve the above object, a semiconductor single-crystal pulling apparatus according to the present invention comprises a crucible in which a semiconductor single-crystal raw material is melted; a heater provided at the periphery of the crucible, for heating the raw material in the crucible; a pulling mechanism for performing pulling of a single crystal by deposition of a single crystal on to a seed crystal as nucleus, the seed crystal being dipped into the raw material molten liquid melted by the heating and pulled from a dipped region where the seed crystal was dipped; and a radiation screen provided above the vicinity of the molten liquid and comprising a conical heat insulating sleeve surrounding the region, the radiation screen being constituted such that heat insulation performance of a lower part thereof is lower than heat insulation performance of an upper part thereof.

With the above construction, the heat insulating performance of the radiation screen surrounding the single-crystal pulling region is different in the upper part and lower part thereof, i.e., the heat insulating performance of the lower part of the radiation screen being lower than that of the higher part of the screen so, in the portion surrounded by the lower part of the radiation screen i.e. the portion in the vicinity of directly above the solid/liquid interface, radiant heat from the molten liquid, the quartz crucible etc reaches the single crystal through the lower part of the screen. The single crystal is therefore heated, and the period for which the single crystal is passing through the high-temperature region becomes long. The portion surrounded by the upper part of the radiation screen, which is of high heat-insulating performance, which the single crystal is pulled through as it grows, is cooled just as conventionally, so it can be made to pass rapidly through the temperature region of about 900° C. to 500° C. Also, by maintaining the gap between the bottom end of the radiation screen and the molten-liquid surface as conventionally, efficient discharge of silicon oxide can be achieved by the inert gas current.

DESCRIPTION OF THE PREFERRED EMBODIMENTS

Embodiments of a semiconductor single-crystal pulling apparatus according to the present invention are described below with reference to the drawings.

Figure 1:
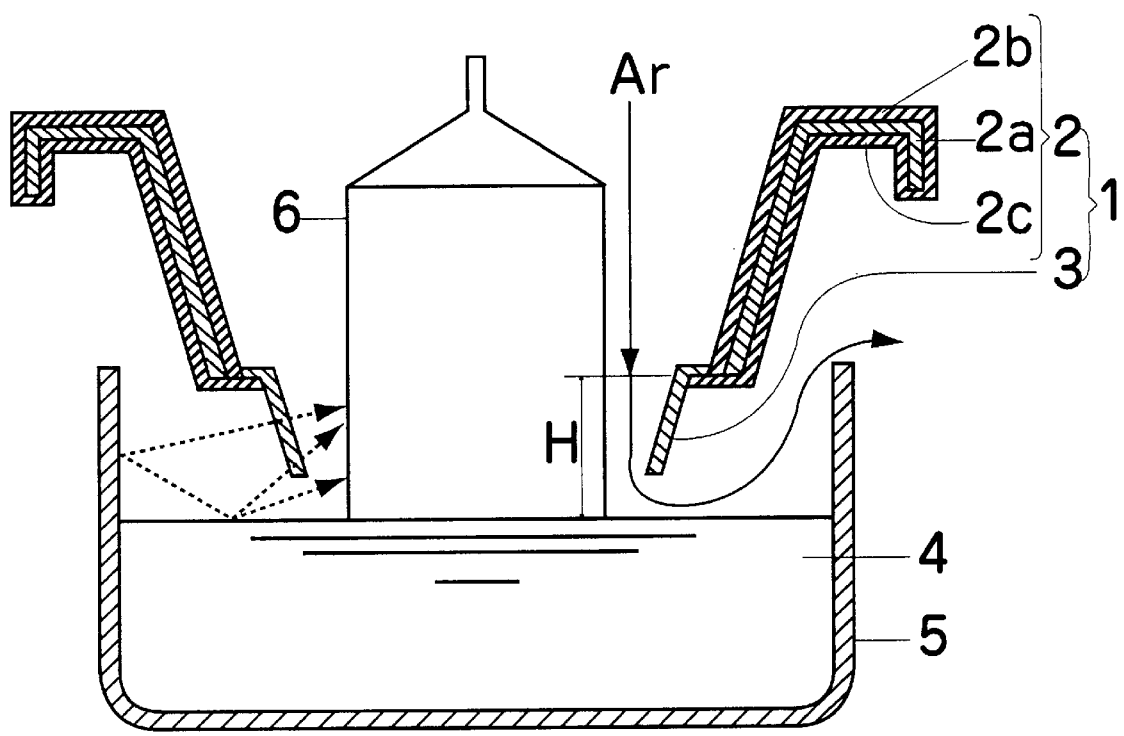
FIG. 1 is a diagrammatic cross-sectional view of a radiation screen and its vicinity according to a first embodiment of the present invention.

FIG. 1 is a diagrammatic cross-sectional view of a radiation screen and its vicinity according to a first embodiment of the present invention in which a radiation screen 1 is divided into an upper screen 2 and a lower screen 3 of different heat-insulating performance. Upper screen 2 is of a three-layer construction, comprising a heat-insulating member 2a made of graphite or ceramics fiber clad by outer member 2b and 2c made of graphite. Upper screen 2 is a conical sleeve whose bottom end aperture is smaller than its upper end aperture, and which is provided with an annular flange at its upper end. At the bottom end of upper screen 2, there is provided a ledge portion, on which a lower screen 3 is mounted. Lower screen 3 is of single-layer construction, made of graphite or quartz or fine ceramics, a flange provided at its upper end engaging with the bottom end of upper screen 2. In FIG. 1, reference numeral 4 is molten liquid, 5 is a quartz crucible, and 8 is a single crystal in the course of being pulled.

Lower screen 3 is of a single layer construction, so it does not have the function of completely shutting off the radiant heat from molten liquid 4 and/or quartz crucible 5 as does the conventional radiation screen. Consequently, radiant heat from molten liquid 4 arrives at the bottom portion of single crystal 6 whilst it is being pulled up either by directly passing through lower screen 3 or by passing through lower screen 3 after being reflected at the inner surface of quartz crucible 5, thereby heating the lower part of single crystal 6. In the case where the conventional radiation screen is employed, the screening of the lower part of the single crystal 6 from radiant heat results in the single crystal passing through the high temperature region of 1050° C. or more for a short time only, before being cooled. However, in the case of the present embodiment, although there is a radiation screen, the single crystal is still subjected to heating, so the time taken for it to pass through the high temperature region is prolonged. In contrast, upper screen 2 has the full heat insulating performance of the conventional screen, so a quenching function to a moderate/lower temperature region can be exhibited. Consequently, when the single-crystal 6 is pulled up from the region of lower screen 3 so that it is surrounded by upper screen 2, it is cooled comparatively abruptly and can pass through the temperature region of about 900° C. to 500° C. in a short space of time. The boundary between upper screen 2 and lower screen 3 is set at a height H corresponding to a temperature region of 1000° C. to 1200° C., preferably at a height corresponding to 1050° C. or thereabouts. In this way, the high temperature zone can be sufficiently prolonged.

For the gap between the bottom end lower screen 3 and the surface of molten liquid 4, the conventional dimensional range is preserved, so that the lower screen 3 exhibits the effect of moderating the flow of inert gas. The inert gas such as argon is introduced from the top of the single-crystal pulling apparatus and flows down along the periphery of single crystal 6 and passes through the gap between the bottom end of lower screen 3 and molten liquid 4 then rises along the inside surface of quartz crucible 5, before being discharged from a discharge aperture provided in the bottom of the single-crystal pulling apparatus.

Figure 2:
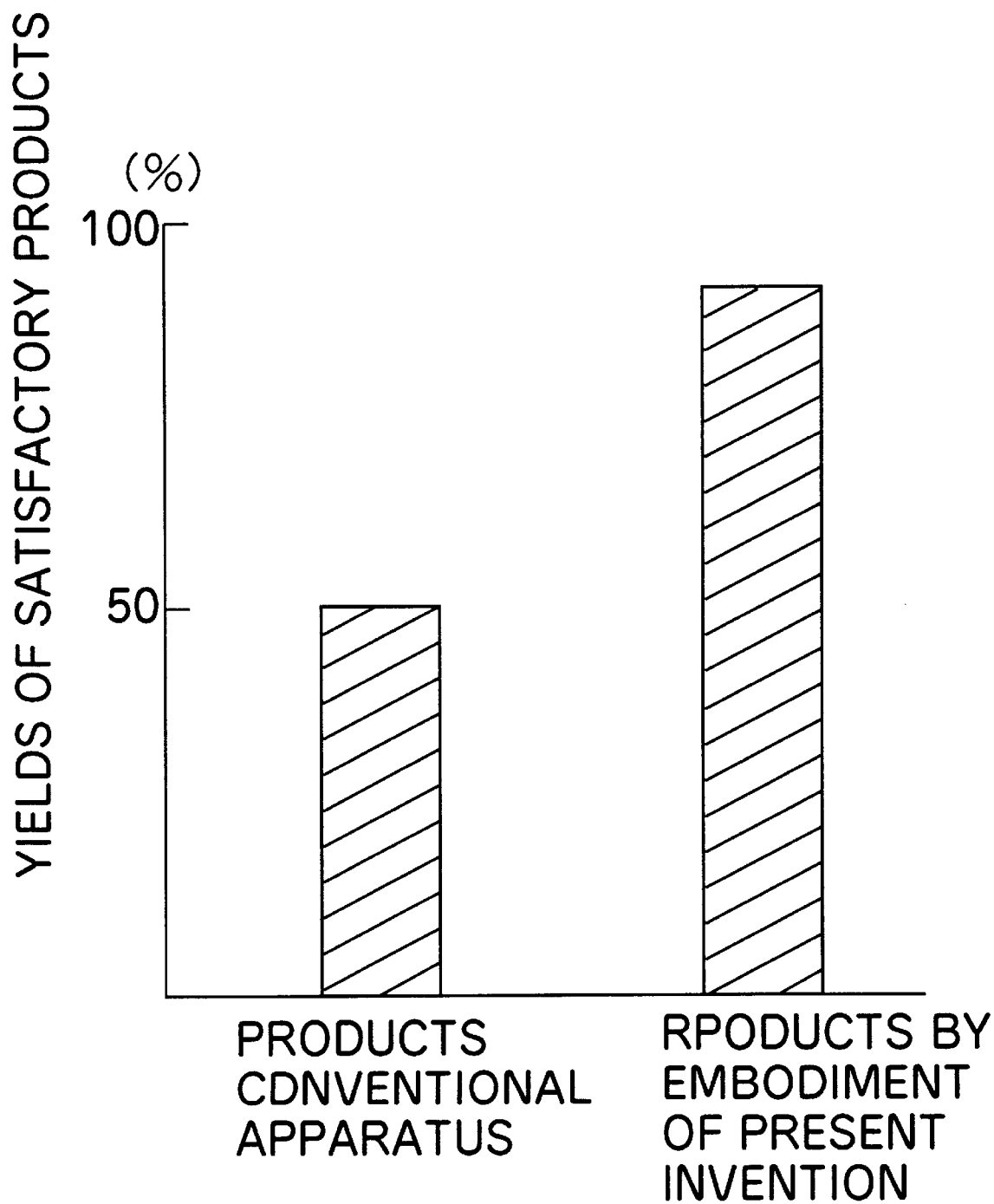
FIG. 2 is a view showing a comparison of the yields of satisfactory products in respect of oxide-film voltage-withstanding ability after device processing, in respect of products according to the first embodiment (FIG. 1) and conventional products.

FIG. 2 is a view showing a comparison of the yields of satisfactory products obtained in regard to oxide-film voltage-withstanding ability after device processing in respect of products obtained using the single-crystal pulling apparatus according to this embodiment and a single-crystal pulling apparatus equipped with a conventional radiation screen. The "yield of satisfactory products" in regard to oxide-film voltage-withstanding ability indicates the ratio of numbers of elements whose insulation breakdown voltage is 8 MV/cm$^2$ or more of the oxide film when a large number of elements are formed on a silicon wafer. As can be seen from FIG. 2, the yield of satisfactory products according to the present embodiment is improved by 1.5 or more times that of the conventional products.

In the first embodiment described above, the upper screen and lower screen were formed separately, but there is no restriction to this construction, which could be modified as appropriate.

Figure 3:
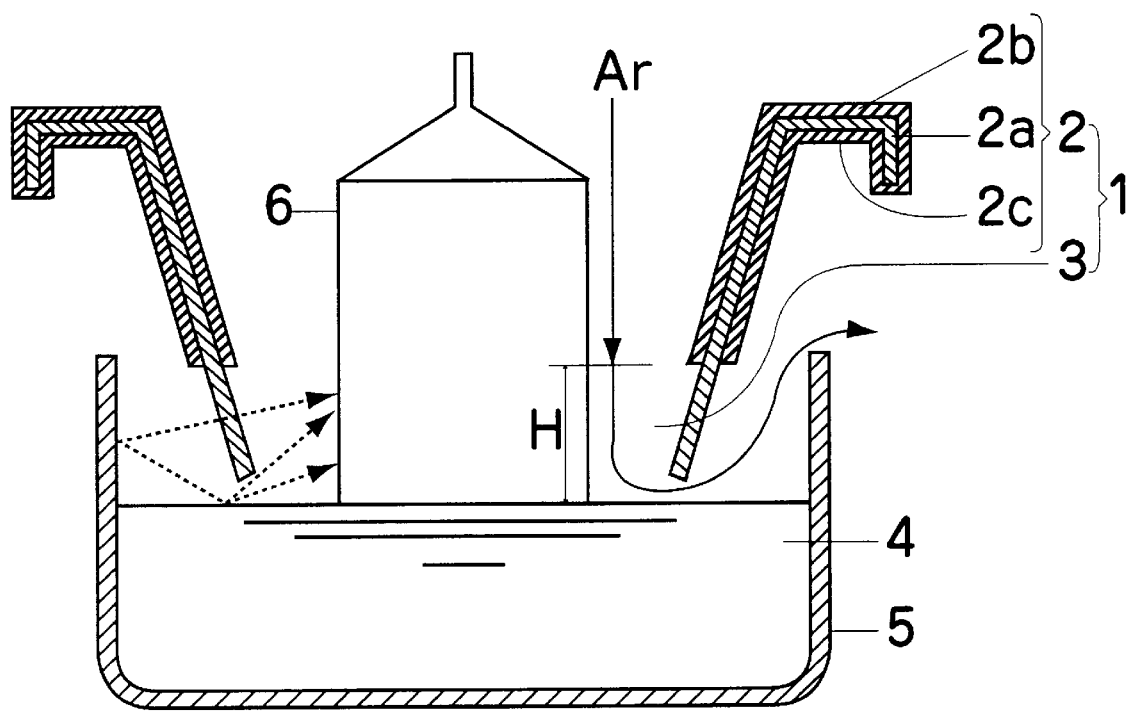
FIG. 3 is a diagrammatic cross-sectional view of a radiation screen and its vicinity according to a second embodiment of the present invention.

Next, as a second embodiment of the present invention, a radiation screen 1 as shown in FIG. 3 is also effective that comprises a plate 13 made of graphite or fine ceramics, whose upper part is clad with an outer member 12 made of graphite.

Figure 4:
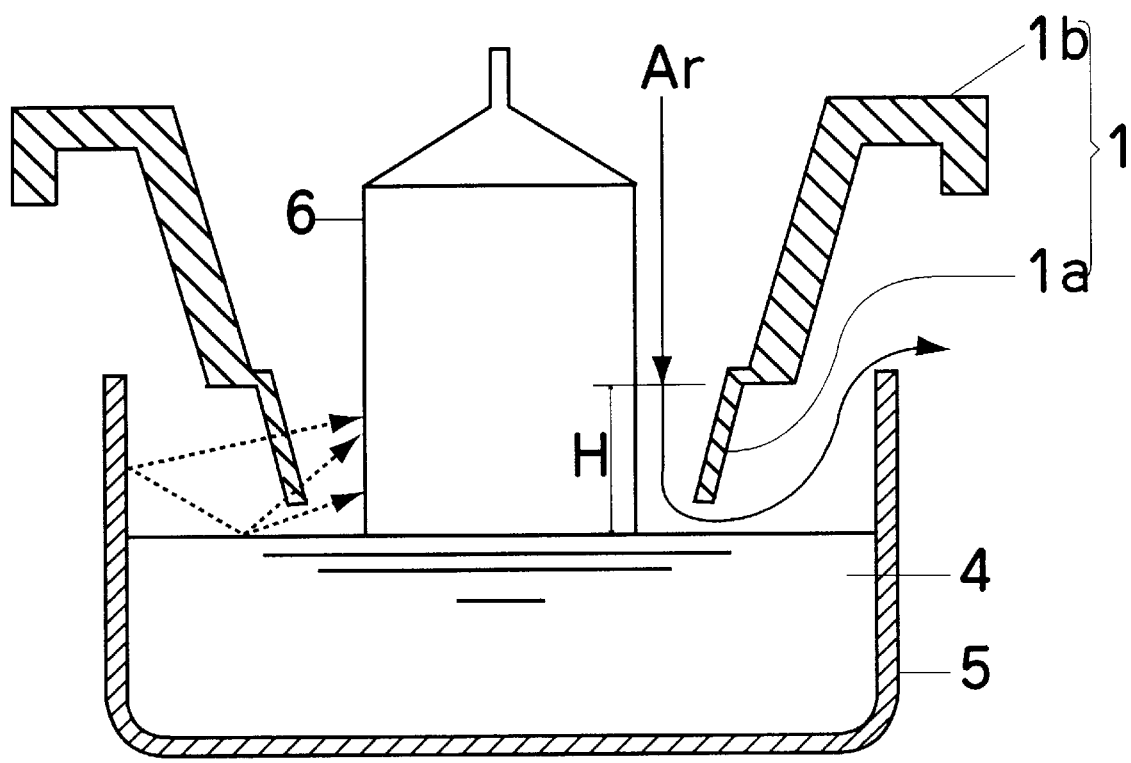
FIG. 4 is a diagrammatic cross-sectional view of a radiation screen and its vicinity according to a third embodiment of the present invention.

Also, as a third embodiment of the present invention, as shown in FIG. 4, radiation screen 1 could be formed integrally by plate made of graphite or fine ceramics, the thickness of upper part 1b being larger than the thickness of lower part 1a.

It should be noted that the outer member 12 is preferably provided as far as the location where the single crystal passes through at 1000° to 1200° C., and even more preferably as far as the location where it passes through at 1050° C.

Figure 5:
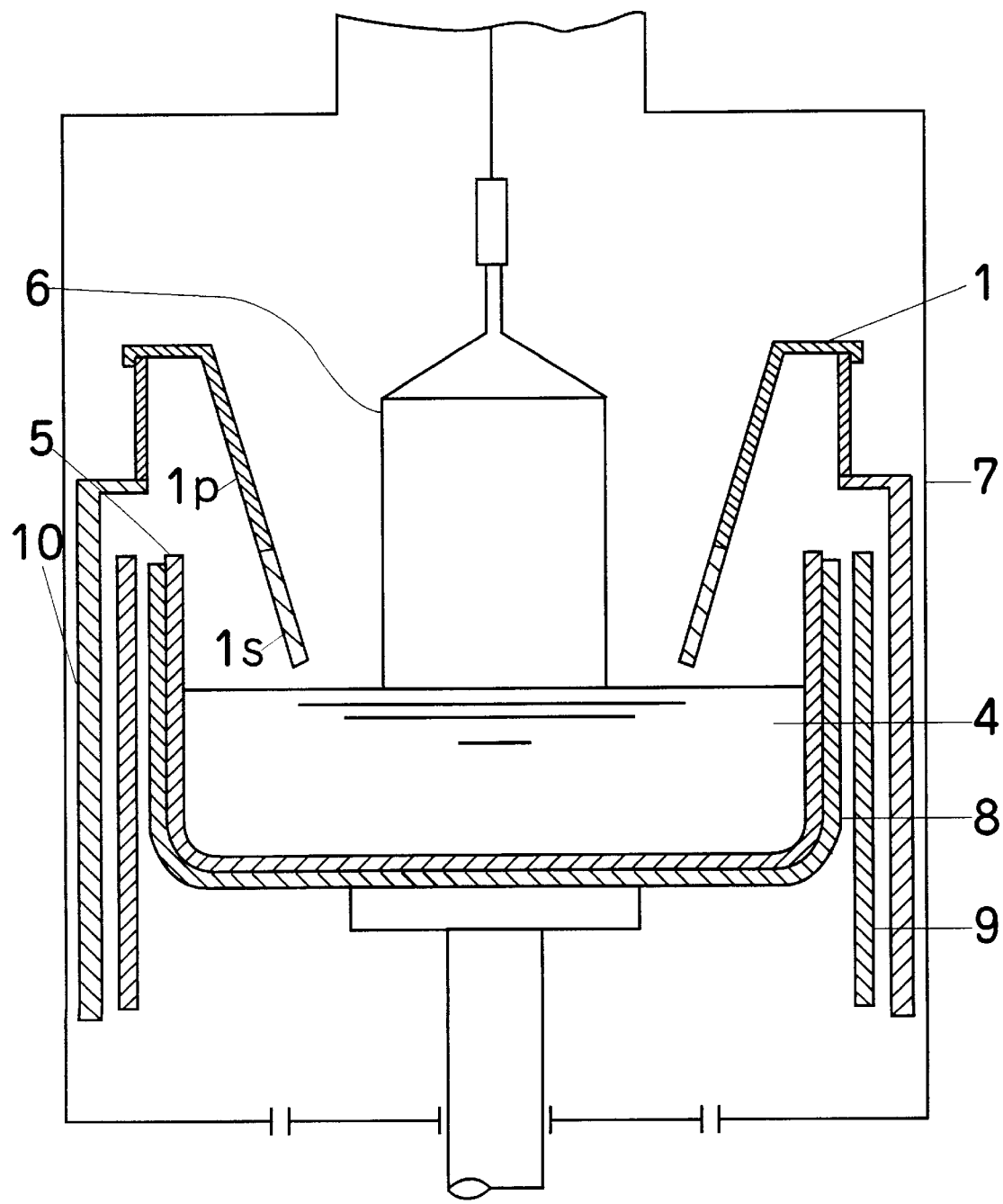
FIG. 5 is a diagrammatic cross-sectional view of a radiation screen and its vicinity according to a fourth embodiment of the present invention.
Figure 6:
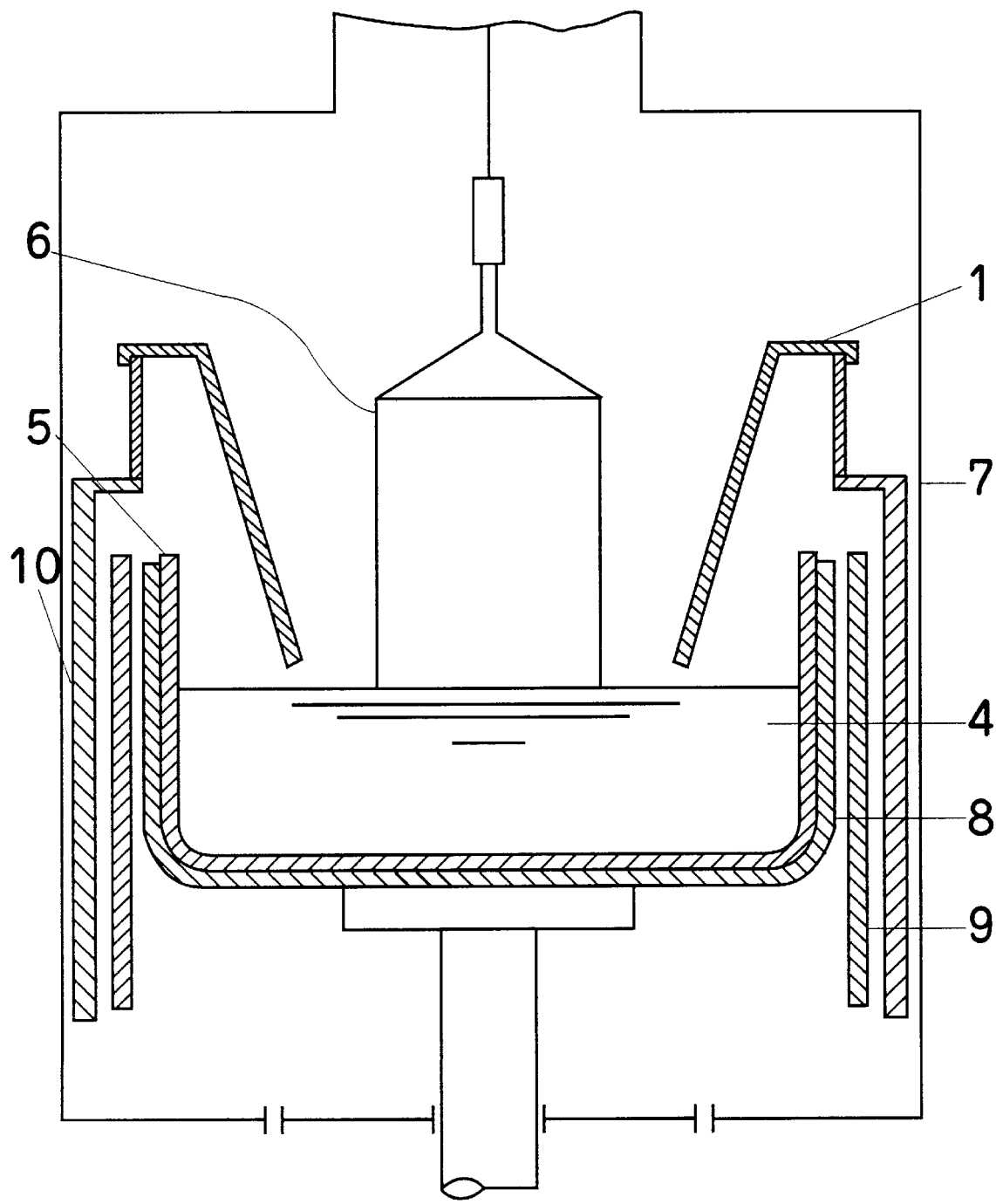
FIG. 6 is a diagrammatic partial cross-sectional view of a conventional semiconductor single-crystal pulling apparatus provided with a radiation screen.

Further, as a fourth embodiment of the present invention, as shown in FIG. 5, radiation screen 1 could be constituted of materials of the same thickness but different properties, lower part 1s being constituted of material of heat transmissivity larger than that of upper part 1p. Apart from this, it is possible to apply any desired thermal history to the single crystal by altering the thickness or the properties of the lower part.

Further, the boundary between the lower screen and upper screen may preferably be set such that this boundary H shown in FIG. 1 is at a location which the single crystal passes through at 1000° C. Also, the oxide-film voltage-withstanding characteristic can of course be improved by eliminating the lower screen.

What is claimed is:

1. Semiconductor single-crystal pulling apparatus comprising:
   a crucible in which a semiconductor single-crystal raw material is melted;
   a heater provided at a periphery of the crucible, for heating the raw material in the crucible;
   a pulling mechanism for performing pulling of a single crystal by deposition of a single crystal on to a seed crystal as nucleus, the seed crystal been dipped into the raw material molten liquid melted by the heater and pulled from a dipped region where the seed crystal was dipped; and
   a radiation screen provided above a vicinity of the molten liquid and comprising a conical heat insulating sleeve surrounding the region, the conical heat insulating sleeve having an upper and a lower part, and the radiation screen is constituted such that heat insulation performance of the lower part is lower than heat insulation performance of the upper part.

2. Semiconductor single-crystal pulling apparatus according to claim 1, wherein the radiation screen is integrally formed, the upper part thereof being clad with a cladding member of the same or different material.

3. Semiconductor single-crystal pulling apparatus according to claim 1, wherein the radiation screen is integrally formed, with greater thickness of the upper part than the lower part.

4. Semiconductor single-crystal pulling apparatus according to claim 2, wherein the cladding member is provided as far as the location where the single-crystal passes at 1000° C.

5. Semiconductor single-crystal pulling apparatus according to claim 4, wherein the radiation screen is made of graphite or fine ceramics, the upper part being clad with an outer member being made of graphite.

6. Semiconductor single-crystal pulling apparatus according to claim 1, wherein the radiation screen is constituted of a lower screen consisting of a conical sleeve having an annular flange at a top thereof and an upper screen consisting of a conical sleeve whose lower end engages with the flange.

7. Semiconductor single-crystal pulling apparatus according to claim 6, wherein the lower screen is of single-layer construction, while the upper screen is of three-layer construction.

8. Semiconductor single-crystal pulling apparatus according to claim 6, wherein the boundary between the lower screen and upper screen is set at a location where the single crystal passes at 1000° C.

9. Semiconductor single-crystal pulling apparatus according to claim 6, wherein the lower screen is made of graphite or fine ceramics, and the upper screen is a heat-insulating member made of graphite or ceramics fibre clad with an outer member made of graphite.

10. Semiconductor single-crystal pulling apparatus according to claim 1, wherein the upper part of the radiation screen is constituted of a member of different material from the lower part thereof.

11. Semiconductor single-crystal pulling apparatus according to claim 10, wherein the lower part of the radiation screen is made of quartz or fine ceramics and the upper part thereof is made of graphite.

12. The semiconductor single-crystal pulling apparatus as claimed in claim 1, wherein said radiation screen is arranged so that the amount of time taken by the single crystal to pass through the temperature region of 1050° C. or more is as long as possible and so that the single crystal rapidly passes through the temperature region of about 900° C. to 500° C.

13. A semiconductor single-crystal pulling apparatus comprising:
   a crucible holding molten raw material of a semiconductor single-crystal raw material;
   a heater arranged at a periphery of the crucible for heating the molten raw material in the crucible;
   a pulling mechanism for pulling of a single crystal by deposition of a single crystal on to a seed crystal as a nucleus, the seed crystal being dipped into the molten raw material and pulled from a dipped region where the seed crystal was dipped; and
   insulation means arranged above the molten raw material for providing dual insulation about a bottom of a pulled single crystal for extending a period of time the bottom of the pulled single crystal is maintained within range of more than 1050° C. and for decreasing the period of time the pulled single crystal is maintained within the range of 500°C. to 900° C.

* * * * *